United States Patent
Rao et al.

(10) Patent No.: US 11,410,133 B2
(45) Date of Patent: Aug. 9, 2022

(54) MANAGEMENT APPARATUS AND MANAGEMENT METHOD THEREOF FOR ELECTRONIC EQUIPMENT

(71) Applicant: Far EasTone Telecommunications Co., Ltd., Taipei (TW)

(72) Inventors: Herman Chunghwa Rao, Taipei (TW); Hua-Pei Chiang, Taipei (TW); Chyi-Dar Jang, Taipei (TW); Che-Yu Liao, Taipei (TW); Tsung-Jen Wang, Taipei (TW)

(73) Assignee: Far EasTone Telecommunications Co., Ltd., Taipei (TW)

( * ) Notice: Subject to any disclaimer, the term of this patent is extended or adjusted under 35 U.S.C. 154(b) by 414 days.

(21) Appl. No.: 16/683,235

(22) Filed: Nov. 13, 2019

(65) Prior Publication Data

US 2020/0210970 A1 Jul. 2, 2020

Related U.S. Application Data

(60) Provisional application No. 62/785,226, filed on Dec. 27, 2018.

(30) Foreign Application Priority Data

Apr. 29, 2019 (TW) .................. 108114928

(51) Int. Cl.
*G06Q 10/00* (2012.01)
*G06F 30/10* (2020.01)
(Continued)

(52) U.S. Cl.
CPC ............ *G06Q 10/20* (2013.01); *G06F 16/29* (2019.01); *G06F 30/10* (2020.01); *G06K 9/6201* (2013.01); *G06T 7/0004* (2013.01); *G06V 10/40* (2022.01)

(58) Field of Classification Search
CPC ........... G06Q 30/0639; G06Q 30/0267; G06Q 20/321; G06Q 10/20; G06F 16/29;
(Continued)

(56) References Cited

U.S. PATENT DOCUMENTS 6,646,564 B1 * 11/2003 Azieres .................. G08B 25/14
340/506
2014/0005838 A1 * 1/2014 Ogura ...................... F24F 11/72
700/276
(Continued)

FOREIGN PATENT DOCUMENTS

CA 3029252 A1 * 2/2018 ........... A61B 5/0022
CA 3051298 A1 * 11/2020 ........... G06K 9/0063
(Continued)

OTHER PUBLICATIONS

Research on the Remote Monitoring and Fault Diagnosis System for Equipment (Year: 2008).*
(Continued)

*Primary Examiner* — Nizar N Sivji
(74) *Attorney, Agent, or Firm* — JCIPRNET

(57) ABSTRACT

A management apparatus and a management method thereof for electronic equipment are provided. The management apparatus includes a detector, a display and a processor. The detector obtains a detected data related to the electronic equipment. The display presents information. The processor is coupled to the display and the detector. The processor is configured to perform the following steps. The electronic equipment is identified according to the detected data of the electronic equipment. The detected data includes an image of the electronic equipment. Electronic equipment information is obtained according to an identified result of the electronic equipment. The electronic equipment information may include specification information, asset information and/or operation configuration. The electronic equipment
(Continued)

information may be displayed on the display. Accordingly, the operation for an on-site engineer would be improved.

18 Claims, 5 Drawing Sheets

(51) Int. Cl.
   *G06F 16/29* (2019.01)
   *G06K 9/62* (2022.01)
   *G06V 10/40* (2022.01)
   *G06T 7/00* (2017.01)

(58) Field of Classification Search
   CPC .......... G06F 3/0484; G06F 3/147; G06F 3/14; G06F 21/31; G06F 16/487; G06F 21/44; G06F 30/10; G06K 9/6215; G06K 9/6201; G06T 2200/24; G06T 7/215; G06T 7/0004; G06V 10/40; G06V 20/64
   See application file for complete search history.

(56) References Cited

U.S. PATENT DOCUMENTS

| | | | |
|---|---|---|---|
| 2018/0293551 A1* | 10/2018 | Buca | G06Q 10/0833 |
| 2019/0004507 A1* | 1/2019 | Daitou | G06Q 10/20 |

FOREIGN PATENT DOCUMENTS

| | | | | |
|---|---|---|---|---|
| CN | 103901072 | | 7/2014 | |
| CN | 104331848 | | 2/2015 | |
| CN | 104331848 A | * | 2/2015 | |
| CN | 105208592 | | 12/2015 | |
| CN | 109038814 | | 12/2018 | |
| TW | M467132 | | 12/2013 | |
| TW | I544740 | | 8/2016 | |
| TW | I549371 | | 9/2016 | |
| TW | I561978 | | 12/2016 | |
| TW | I627594 | | 6/2018 | |
| TW | 201830848 | | 8/2018 | |
| TW | M570975 | | 12/2018 | |
| TW | M587291 | | 12/2019 | |
| WO | WO-2021183976 A1 | * | 9/2021 | ............. G06F 21/31 |

OTHER PUBLICATIONS

Power Monitoring Devices: Trends in Power Automation (Year: 1993).*
"Office Action of Taiwan Counterpart Application," dated Feb. 12, 2020, p. 1-p. 11.
Opensignal, "Mobile Analytics and Insights—Opensignal", retrieved on Nov. 13, 2019, https://www.opensignal.com/.
Office Action of Taiwan Counterpart Application, dated Feb. 21, 2022, pp. 1-14.

* cited by examiner

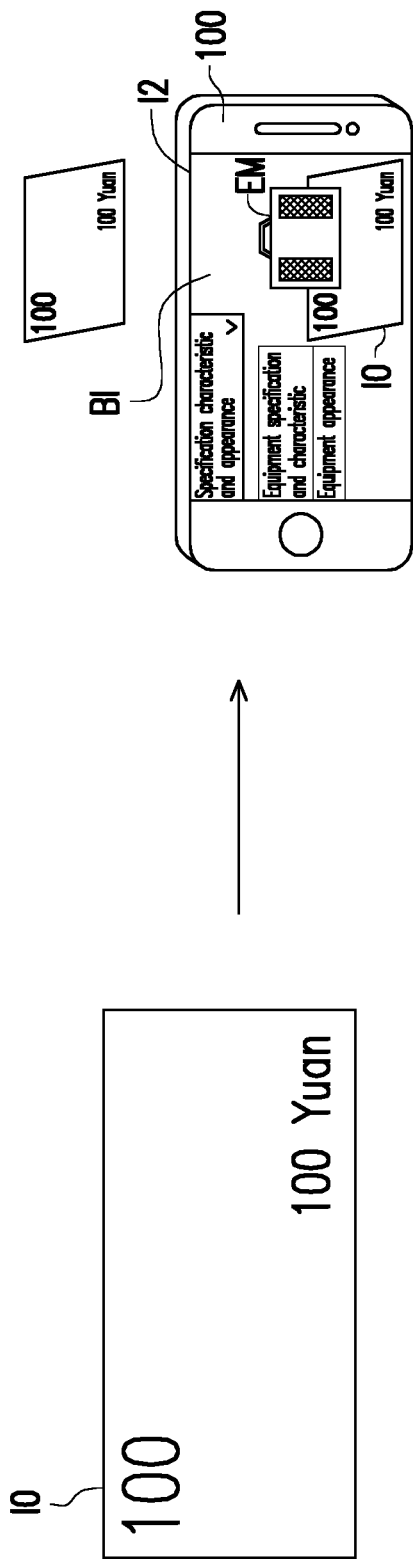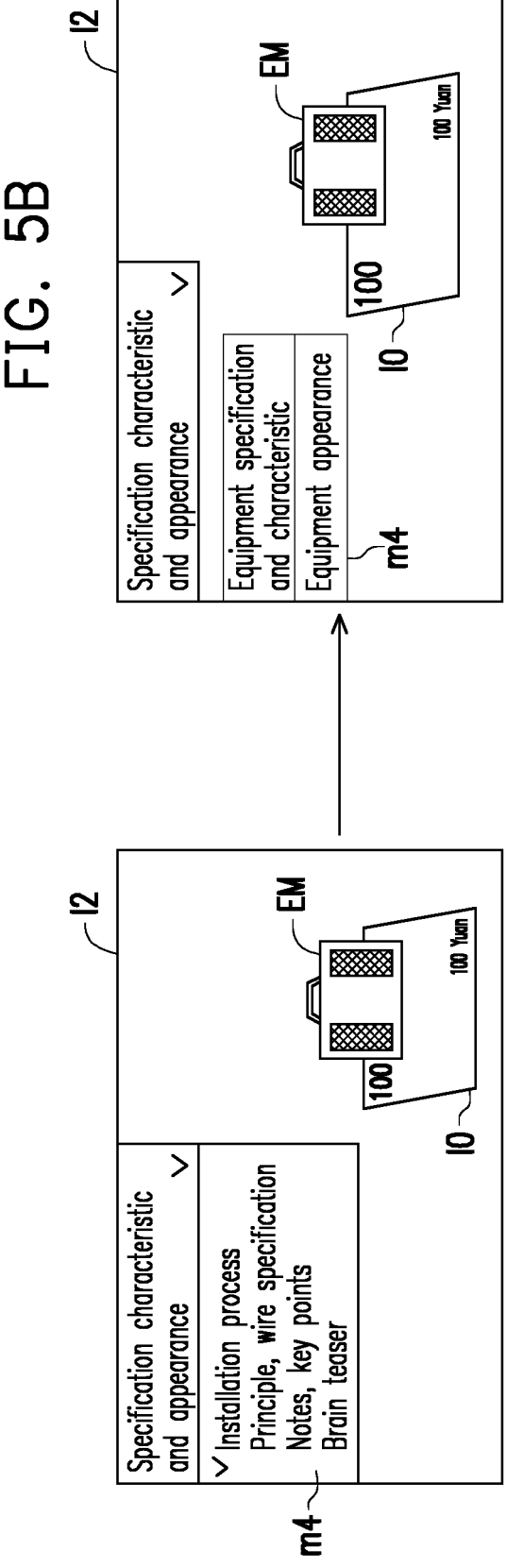

MANAGEMENT APPARATUS AND MANAGEMENT METHOD THEREOF FOR ELECTRONIC EQUIPMENT

CROSS-REFERENCE TO RELATED APPLICATION

This application claims the priority benefits of U.S. provisional application Ser. No. 62/785,226, filed on Dec. 27, 2018, and Taiwan application serial no. 108114928, filed on Apr. 29, 2019. The entirety of each of the above-mentioned patent applications is hereby incorporated by reference herein and made a part of this specification.

BACKGROUND OF THE DISCLOSURE

1. Field of the Disclosure

The present disclosure relates to electronic equipment, and in particular, to a management apparatus and a management method thereof for electronic equipment.

2. Description of Related Art

Along with rapid development of science and technology, gradual popularization of mobile devices (such as a mobile phone, a tablet PC and a notebook computer) is promoted, and the mode that the mobile devices surf the internet via a mobile network gradually becomes the main trend. However, for conforming to users in explosive growth and provide good internet surfing quality for the users, telecommunication operators need to constantly built or update electronic equipment (such as a base station, an optical communication transceiver, a router, electrical equipment or the like) related to telecommunication.

These construction as well as maintenance and operation generally need to be executed by professional staff on site in person. Most maintenance and manual operation generally construct or troubleshoot by depending on experience, and the existing technology does not provide any intelligent assistance to promote the operation efficiency or reduce faults. Therefore, how to effectively assist the maintenance and manual operation of the electronic equipment is one of problems the telecommunication operators try to solve.

SUMMARY OF THE DISCLOSURE

The present disclosure provides a management apparatus and a management method thereof for electronic equipment, which obtain relevant extended information of the electronic equipment by equipment image identification, and combine with other additional functions accordingly, so as to promote the convenience and increase the working efficiency of personnel.

The management apparatus for electronic equipment of an embodiment of the present disclosure includes a detector, a display and a processor. The detector is used for obtaining a detected data related to the electronic equipment. The display is used for presenting information. The processor is coupled to the display and the detector, and is configured to perform the following steps. The electronic equipment is identified according to the detected data of the electronic equipment, the detected data including an image of the electronic equipment. Electronic equipment information is obtained according to an identified result of the electronic equipment, the electronic equipment information including specification information, asset information and/or operation configuration. The electronic equipment information is displayed on the display.

On the other hand, a management method for the electronic equipment of an embodiment of the present disclosure includes the following steps. A detected data related to electronic equipment is obtained. The electronic equipment is identified according to the detected data of the electronic equipment, the detected data including an image of the electronic equipment. Electronic equipment information is obtained according to an identified result of the electronic equipment, the electronic equipment information including specification information, asset information and/or operation configuration. The electronic equipment information is displayed.

Based on the foregoing, the management apparatus and the management method thereof for electronic equipment of the embodiments of the present disclosure capture the image of the electronic equipment, analyze the image and a current position to identify the electronic equipment, and then map to relevant extended information (for example, specification, asset, setting, state, a comparison sheet and the like) of the electronic equipment. The extended information will be capable of assisting maintenance and manual operation in a currently executed operation. Moreover, the embodiments of the present disclosure may further combine with the functions of spatial model view, microcosmic view of equipment, educational training, work order integration, troubleshooting and the like. Therefore, the efficiency of workers may be effectively promoted and the occurrence of faults is reduced.

In order to make the aforementioned and other objectives and advantages of the present disclosure comprehensible, embodiments accompanied with figures are described in detail below.

BRIEF DESCRIPTION OF THE DRAWINGS

FIG. 5A-5D are augmented reality (AR) application of an exemplary description.

DESCRIPTION OF THE EMBODIMENTS

Figure 1:
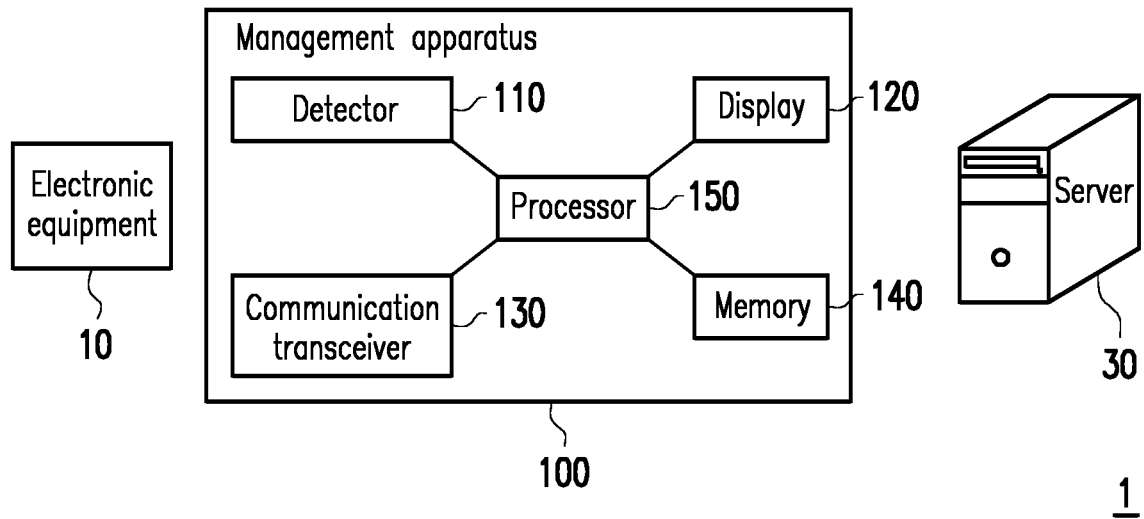
FIG. 1 is a system architecture diagram according to an embodiment of the present disclosure.

FIG. 1 is a system architecture diagram according to an embodiment of the present disclosure. Referring to FIG. 1, such a system includes but not limited to electronic equipment 10, a server 30 and a management apparatus 100. It should be noted that, the quantity of each equipment shown in FIG. 1 may be increased according to practical application.

The electronic equipment 10 may be one of various types of telecommunication equipment including a base station, an optical communication transceiver, a router, a gateway, a rear-end server and the like, electrical equipment (for example, lightning protection, grounding power supply units or the like) related to the foregoing telecommunication equipment, air conditioning equipment (for example, a cooler, a dehumidifier and the like), monitoring equipment (for example, a monitor, an alarm and the like), or any other electronic apparatuses.

The server 30 may be one of various types of servers (for example, a proxy server, an application server, a cloud server, a database, or an operation platform, or the like), a desktop computer, a workstation and other equipment. For example, the server records a mass of data information of a construction system, an asset management system, a work order management system, an educational training system, an image identification system and the like.

The management apparatus 100 may be a mobile device such as a smart phone, a tablet PC, a notebook computer, a handheld personal digital assistant or the like. The management apparatus 100 includes but not limited to a detector 110, a display 120, a communication transceiver 130, a memory 140 and a processor 150.

The detector 110 may be a sensor sensing physical information such as an image, sound, temperature, position, and a touch or motion state. For example, the detector is a device such as an image capture device, a microphone, a satellite locator, an accelerometer, a touch panel, a thermal imaging device or the like. The type of the detector 110 may be determined by a user himself/herself according to different requirements, and is not limited in the embodiments of the present disclosure.

The display 120 may be a device such as a liquid-crystal display (LCD), a light-emitting diode (LED) display, an organic light-emitting diode (OLED) or the like.

The communication transceiver 130 may be a transmitter and an emitter supporting wireless communication technologies such as any mobile communication, Wi-Fi and the like, and is used for transmitting and/or receiving data with an external apparatus. For example, the communication transceiver 130 is connected to the server 30.

The memory 140 is an immobilized or mobile memory of any form, including a random access memory (RAM), a flash memory, a traditional hard disk drive (HDD), a solid-state disk (SSD), other non-volatile memories or similar elements or a combination of the foregoing elements. In the present embodiment, the memory 140 is used for storing data or documents such as buffered or permanent data (for example, data obtained by the detector 110, spatial model parameters, electronic equipment information and the like), a software module, an operating system, an application (for example, an application (called as management APP (application) for short) used for managing the electronic equipment 10), and a driver, and the detailed content will be explained in detail in the following embodiment.

The processor 150 is coupled to the detector 110, the display 120, the communication transceiver 130 and the memory 140. The processor 150 may be a central processing unit (CPU), or another programmable general-purpose or special-purpose microprocessor, a digital signal processor (DSP), a programmable controller, an application-specific integrated circuit (ASIC) or other similar elements, or a combination of the foregoing elements. In the embodiments of the present disclosure, the processor 150 is used for executing all operations of the management apparatus 100, and may be loaded and execute those software modules or management APP stored by the memory 140.

In order to conveniently understand the operation process of the embodiments of the present disclosure, the operation process of the management apparatus 100 in the embodiments of the present disclosure will be described in details with a lot of embodiments. Hereinafter, the method of the embodiments of the present disclosure will be described in match with various elements and modules of the management apparatus 100, the electronic equipment 10 and the server 30. All processes of the method may be adjusted according to implementation situations, and are not limited thereto.

Figure 2:
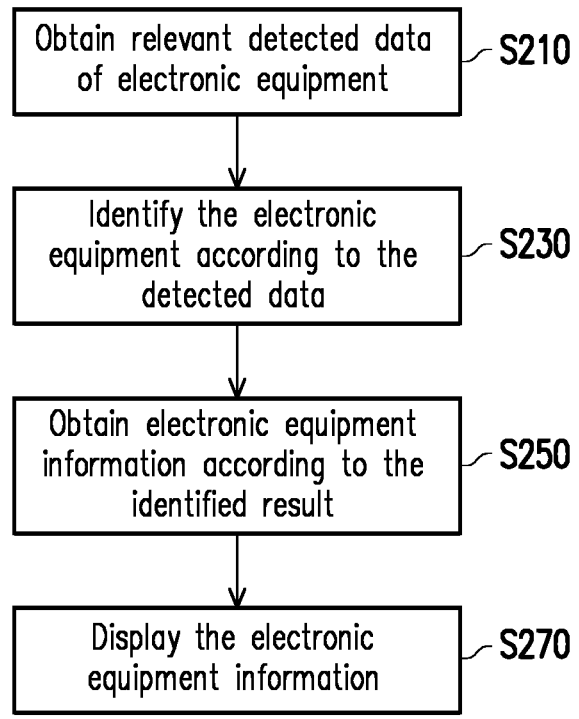
FIG. 2 is a flow diagram of a management method for electronic equipment according to an embodiment of the present disclosure.

FIG. 2 is a flow diagram of a management method for the electronic equipment 10 according to an embodiment of the present disclosure. Referring to FIG. 2, each process of the management method may be implemented on the management APP, so as to be convenient for the user to operate, but is not limited to such an implementation mode. The user may need to input an account and a password to login, and may use functions (different account numbers may have corresponding function authorities) on the management APP after passing authentication. The processor 150 obtains relevant detected data of the electronic equipment 10 by the detector 110 (step S210). For example, a user interface may be provided on the management APP, and the user determines the corresponding detector 110 or the corresponding detector 110 is automatically started. According to the type difference of the detector 110, the detector 110 may obtain corresponding detected data (namely, an image, sound, position information or the like) by a detection manner such as photographing a picture of the electronic equipment 110, recording sound, receiving an input operation (for example, inputting a platform identification code) of the user, or satellite positioning, or the like.

Then, the processor 150 may identify the electronic equipment 10 according to the detected data of the electronic equipment 10 obtained in step S210 (step S230). To be more specific, the present disclosure provides multiple identification technologies to promote the identification accuracy. In an embodiment, the detected data is an image of the electronic equipment 10, and the processor 150 may identify the model number and/or identification code of the electronic equipment 10 by, for example, an artificial intelligence (AI) technology (for example, neural network (NN), a support vector machine (SVM), adaptive boosting (AdaBoost), and the like), or other image identification algorithms. It should be noted that, the server 30 or the processor 150 may train image of various types of electronic equipment 10 in an off-line stage, so as to establish or adjust a classifier/classification model used by the artificial intelligence technology. Moreover, the processor 150 may transmit the image to the server 30 by the communication transceiver 130 to execute the identification operation, and it is also possible that an image identification processing module is built in the processor 150.

Figure 3A:
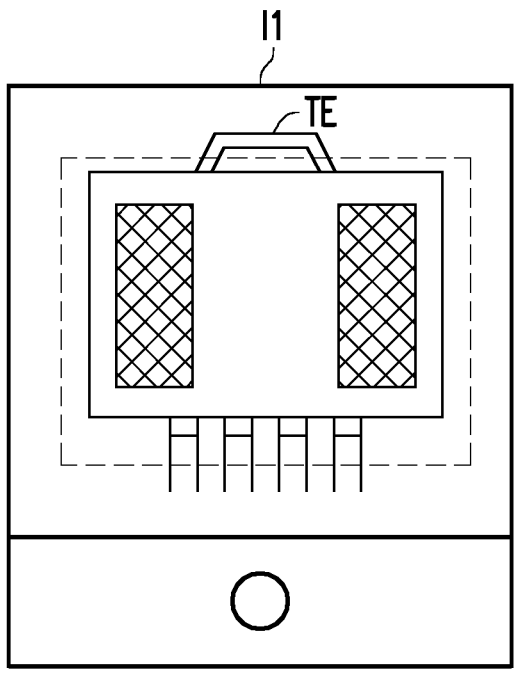
FIG. 3A-3D are schematic diagrams of equipment identification according to an embodiment of the present disclosure.
Figure 3B:
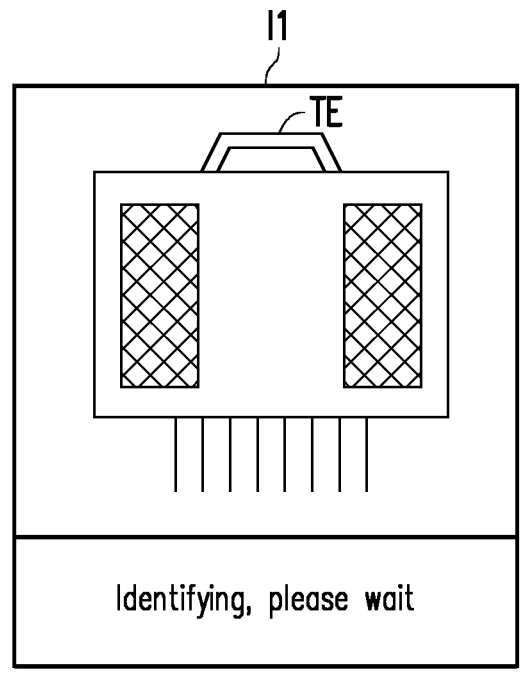
Figure 3C:
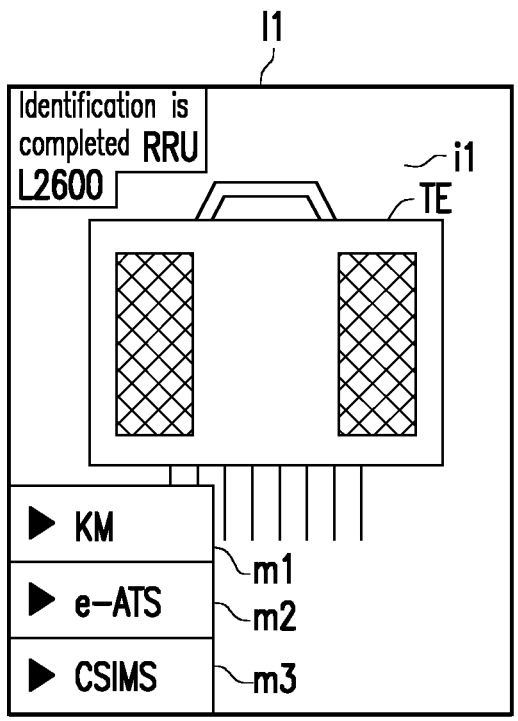
Figure 3D:
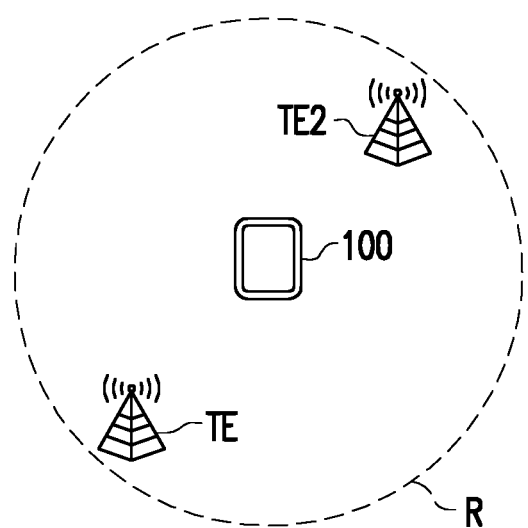

For example, FIG. 3A-3D are schematic diagrams of equipment identification according to an embodiment of the present disclosure. Referring to FIG. 3A first, a user interface I1 of the management APP presented by the display 120 displays a picture photographed by the detector 110 (taking an image capture device as an example). After the user photographs one or more images of the electronic equipment IE (taking a base station as an example), referring to FIG. 3B, the processor 150 may identify these images. Referring to FIG. 3C then, the processor 150 may present an identified result i1 (for example, equipment model number, brand and the like) on the user interface I1.

In another embodiment, the detected data is position information (for example, longitude and latitude coordinates, relative position and the like) based on satellite positioning (for example, a global positioning system (GPS), Galileo, Beidou navigation satellite system and the like). The processor 150 may compare adjacent electronic equipment on an electronic map according to the position information. Taking FIG. 3D as an example, the display 120 may present the electronic map, and presents adjacent electronic equipment TE, TE2 in a specific range R by taking the management apparatus 100 as a center. It should be noted that, the processor 150 may take the nearest electronic equipment TE or TE2 as the identified result, and may also confirm the correctness of the result in combination with an image identified result.

In a further embodiment, the detected data is sound data. For example, the user speaks out contents such as an equipment model number, an identification code, a current position and the like. The processor 150 converts the content of the sound data into corresponding/conforming characters based on a sound identification technology (for example, automatic speech recognition (ASR), speed to text (STT) identification or the like). The converted characters may be taken as the identified result.

In still another embodiment, the detected data is the content input by the input operation of the user. For example, the display 120 provides a model number menu or an input field for the user to select or input specific characters. These input or selected contents may be taken as the identified result.

It should be noted that, in order to promote the identification ability, in some embodiments, the processor 150 may also combine with and comprehensively judge identified results of different types of detected data. Moreover, the embodiments of the present disclosure do not limit that an identification processor is the management apparatus 100 or the server 30 (for example, the identified result coming from the server 30 is obtained by sending detected data by the communication transceiver 130).

Then, the processor 150 may obtain the electronic equipment information according to the identified result of the electronic equipment 10 (Step S250). The electronic equipment information may be specification information (for example, a model number, a support technology and the like), asset information (for example, a subordinate unit, a product ID, a project name, inventory information, an equipment list and the like), operation state (for example, alarm condition, fault condition and the like) and enterprise resource planning (ERP) information, and operation setting (for example, an operation frequency band, an antenna direction, a radio frequency (RF) report, a transmission speed and the like). It should be noted that, many types are possible for the electronic equipment information according to the difference of application situations. For example, the types include user permission, information or specification comparison sheets of different brands or models, work order information, educational training data, an information distribution map of the base station, efficiency detection (for example, transmission speed, error rate and the like) and the like. The server 30 may search (in combination with an AI search engine) based on the electronic equipment information and map to the corresponding database, so as to provide the electronic equipment information selected or required by the user accordingly. Then, the processor 150 may display the selected electronic equipment information on the display 120, for the user to watch (step S270). Therefore, relevant extended information provided by the background may be accessed instantaneously, so as to assist the field/front-end personnel for operation or troubleshooting.

Taking FIG. 3C as an example, many menus m1-m3 are presented on the user interface I1, which respectively correspond to a knowledge management (KM) system, an enhanced asset tracking system (e-ATS), and a cell/site integration management system (CSIMS). In response to the selection of the menu m1, the display 120 may present information such as a maintenance manual, an installation manual and the like. In response to the selection of the menu m2, the display 120 may present information such as an equipment number, a subordinate organization and the like. In response to the selection of the menu m3, the display 120 may present information such as a platform number, a technology type, an equipment mode and a radio frequency report.

For another example, an alarm device is provided beside the electronic equipment 10, and this alarm device presents alarm information such as temperature, power and fire. The processor 150 may analyze an image containing the alarm device, so as to judge the alarm condition of the electronic equipment.

For a further example, the server 30 searches for and obtains corresponding work order information based on the image. This work order information is related to the construction or maintenance and operation of the electronic equipment 10. For example, the work order information includes a construction process, a maintenance unit, asset position, construction date and the like. The processor 150 also may integrate the work order information with the electronic equipment information, and present an integrated result on the display 130.

Figure 4:
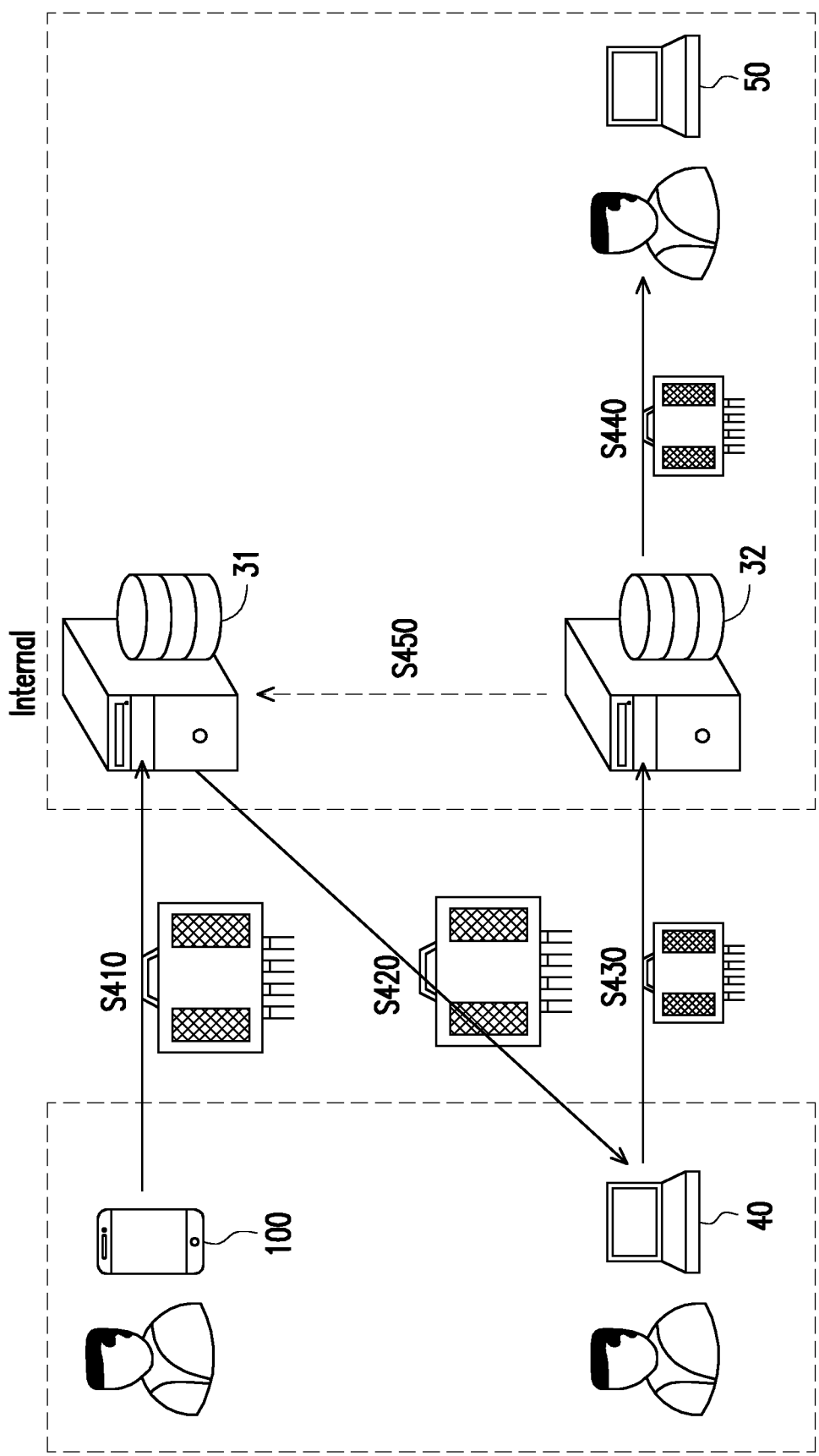
FIG. 4 is a schematic diagram of equipment construction and checking according to an embodiment of the present disclosure.

There are still many extended applications of the electronic equipment 10. In an embodiment, aiming at the construction process of the electronic equipment 10, the management apparatus 100 may upload pictures or relevant information to the server 30, so as to sign off the construction process. For example, FIG. 4 is a schematic diagram of equipment construction and checking according to an embodiment of the present disclosure. Referring to FIG. 4, the management apparatus 100 obtains synchronous information of the electronic equipment 10 by satellite positioning. It is assumed that an erection engineer photographs the electronic equipment 10 after construction is completed, and uploads a photographed image to a database server 31 (a form of the server 30) (step S410). A document engineer downloads relevant images and data by a computer 40 (step S420), and the computer 40 classifies these images and data, and checks to generate a check report (step S430). An application server 32 (another embodiment of the server 30) transmits the check report (step S440), for audit personnel to confirm (by a computer 50), and provides working rule serial number information accordingly (step S450). Therefore, the construction confirming process may be assisted by uploading the data to cloud.

In another embodiment, the processor 150 may identify and/or analyze an equipment defect according to the detected data. This equipment defect is related to a construction fault or an equipment trouble. For example, a power connector is exposed outside, and is not protected by a waterproof cover, and then connector corrosion may be caused. Excessive bending extent of a fiber optical transmission line causes the possibility that the interior of the transmission line breaks, and then a failure in signal transmission may be caused. The processor 150 may upload images (namely, the detected data) containing the electronic equipment to the server 30 by the communication transceiver 130, and may check the equipment defect corresponding to a database, and obtain a fault or trouble type and solution information thereof (that is, a solution scheme for resolving a fault or troubleshooting) according to the equipment defect. The processor 150 then may present the solution information by the display 120, so as to assist the user in troubleshooting. For example, the processor prompts to add a waterproof jacket, re-arrange the transmission line and the like.

It may be seen from this, the processor 150 may directly send the detected data (for example, the image photographed by the electronic equipment 10, or the content input by the user himself/herself) by the communication transceiver 130. After big data analysis, the management apparatus 100 may obtain the corresponding rear-end information provided by the server 30. According to different application situations, the rear-end information may be related to equipment setting, personnel operation (for example, construction flow, maintenance steps and the like) or troubleshooting information.

In an embodiment, the present disclosure also provides a view of the equipment in a three-dimensional form. To be more specific, the processor 150 may select a spatial model according to the electronic equipment information. This spatial model is a model that the electronic equipment 10 is in the three-dimensional form. The processor 150 may construct the spatial model on the background image. This background image, for example, is a simulated virtual image or a real-time image photographed by the image capture device currently. Then, the processor 150 presents a picture that the spatial model is combined with the background image on the display 120, so as to achieve application of augmented reality or virtual reality (VR), mixed reality (MR) and extended reality (XR) or other reality technologies combining reality/virtual systems. This spatial model not only may be used for providing education training, but also may assist the field personnel in knowing an equipment structure.

FIG. 5A-5D are augmented reality (AR) application of an exemplary description. Referring to FIG. 5A, it is assumed that a banknote I0 is taken as a target object and placed on a flat surface. Referring to FIG. 5B, the management APP starts a camera function, and the user may align a lens to the banknote I0, so as to determine a reference plane BI in a picture I2 presented by the display 120, so as to present a spatial model EM of the electronic equipment 10 in the picture I2 at the same time (by a spatial model development tool or engine). Referring to FIG. 5C and 5D, the menu m4 may be provided on the user interface, for the user to watch the content of detailed rules and regulations, and the content may be different.

Figure 6:
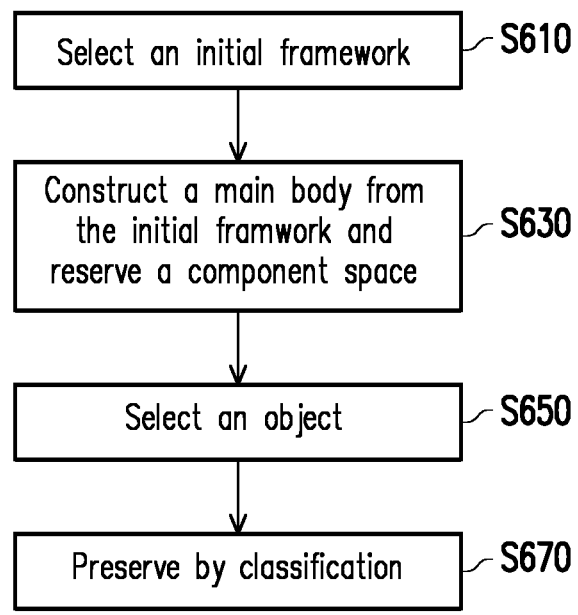
FIG. 6 is a flow diagram of construction of a spatial model according to an embodiment of the present disclosure.

In order to provide the spatial model, the management apparatus 100 needs to perform construction operation first. FIG. 6 is a flow diagram of construction of a spatial model according to an embodiment of the present disclosure. Referring to FIG. 6, the memory 140 stores basic models of the main body, components and the like in advance. The processor 150 evaluates and selects an initial framework of the spatial model (step S610), and establishes the main body of the electronic equipment 10 in the initial framework and reserves a component space in the main body (step S630). Then, the processor 150 may select an object (namely, a component in the electronic equipment 10) in response to the operation of the user and put into the main body (step S650). The processor 150 may re-construct the main body in response to insufficiency of the component space (for example, the component is too large), and the processor 150 may re-construct the main body and repeat step S650. Moreover, the processor 150 may preserve the object and corresponding data in the memory 140 by classification (step S670). The user may get familiar after operating several objects repeatedly. Finally, the spatial model completed in combination may be converted to be in a specific document format, to be used by the management APP.

Moreover, according to the present disclosure, the spatial model may be constructed by a real-time scanning mode. In an embodiment, the detected data is an image scanning data of the electronic equipment 10. The processor 150 may construct the spatial model based on the detected data. When the electronic equipment 10 is damaged, the processor 150 or the server 30 may analyze the damage condition, and repair the spatial model accordingly (by a spatial model development tool). It is noteworthy that, each electronic equipment 10 may have many types of corresponding digitalized contents (for example, equipment components, construction specification and the like), and these digitalized contents all may be used for damage analysis and repair, and further may be used for educational training.

The present disclosure also provides an ant man mode aiming at view of the spatial model. In an embodiment, the processor 150 may present the spatial model on the display 120 in micro-scale in response to the magnifying operation of the user (for example, a touch panel on the management apparatus 100 receives an operation that double fingers keep away from each other oppositely). Such micro-scale represents that the size of the spatial model may exceed real equipment. With the micro-scale, the user is shrunk equivalently, and then components or structures which are zoomed in may be observed. Moreover, the processor 150 may advance to a corresponding direction in response to a moving operation of the user (for example, the touch panel receives a sliding operation), so as to be convenient for the user to know structures of different areas.

To sum up, the management apparatus and management method thereof for electronic equipment of the embodiments of the present disclosure provide intelligent identification of the equipment, and bring in relevant electronic equipment information, such as specification, asset, setting, state analysis, a spatial model and a troubleshooting scheme, needed by the user. The information relevant to the electronic equipment and obtained by the management apparatus may be uploaded to the server in real time, and may be subjected to big data analysis and artificial intelligence searching to dig out appropriate and abundant information. Signing-off of construction and maintenance and operation may be transmitted to corresponding units or personnel seamlessly in real time. Moreover, by examination of the spatial model, the information may help the field personnel or be used by educational training. Therefore, the efficiency of the field workers may be effectively promoted, and the occurrence of faults is reduced.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A management apparatus for electronic equipment, comprising:
   a detector, obtaining a detected data related to the electronic equipment;
   a display, presenting information; and
   a processor, coupled to the display and the detector, and the processor being configured to:

identify the electronic equipment according to the detected data of the electronic equipment, the detected data including an image of the electronic equipment;

obtain electronic equipment information according to an identified result of the electronic equipment, the electronic equipment information including at least one of specification information, asset information, operation state and operation configuration;

construct a spatial model of the electronic equipment based on the detected data by a real-time scanning, wherein the detected data is an image scanning data of the electronic equipment;

analyze a damage condition of the spatial model and repair the damage condition of the spatial model; and display the electronic equipment information and the spatial model on the display.

2. The management apparatus for electronic equipment according to claim 1, wherein the detected data further includes one of sound and position information of the management apparatus, while the processor is configured to:
identify the electronic equipment conformed to the sound, or
compare adjacent electronic equipment recorded on an electronic map according to the position information.

3. The management apparatus for electronic equipment according to claim 1, wherein the processor is configured to:
obtain work order information according to the detected data, the work order information being related to construction or maintenance and operation of the electronic equipment; and
integrate the work order information with the electronic equipment information, and present an integration result on the display.

4. The management apparatus for electronic equipment according to claim 1, wherein the processor is configured to:
identify an equipment defect according to the detected data, the equipment defect being related to a construction fault or an equipment trouble; and
obtain corresponding solution information according to the equipment defect.

5. The management apparatus for electronic equipment according to claim 1, wherein the processor is configured to:
select the spatial model according to the identified result;
construct the spatial model on a background image, the background image being one of a virtual image or a real-time image; and
combine the spatial model with the background image to present on the display.

6. The management apparatus for electronic equipment according to claim 5, wherein the processor is configured to:
select an initial framework;
construct a main body based on the initial framework and reserve a component space in the main body;
select at least one object placed in the component space of the main body;
re-construct the main body in response to insufficiency of the component space; and
preserve the at least one object and corresponding data by classification.

7. The management apparatus for electronic equipment according to claim 5, wherein the processor is configured to:
present the spatial model on the display in micro-scale in response to an magnifying operation.

8. The management apparatus for electronic equipment according to claim 1, further comprising:

a communication transceiver, coupled to the processor and transceiving data, wherein the processor is configured to:
send the detected data by the communication transceiver; and
obtain rear-end information corresponding to the detected data by the communication transceiver, the rear-end information being related to information of equipment setting, manual operation or troubleshooting.

9. The management apparatus for electronic equipment according to claim 1, wherein the processor is configured to:
obtain information about different brands or models or a specification comparison sheet for the identified result of the electronic equipment.

10. A management method for electronic equipment, comprising:
obtaining a detected data related to electronic equipment;
identifying the electronic equipment according to the detected data of the electronic equipment, the detected data including an image of the electronic equipment;
obtaining electronic equipment information according to an identified result of the electronic equipment, electronic equipment information including at least one of specification information, asset information, operation state and operation configuration;
construct a spatial model of the electronic equipment based on the detected data by a real-time scanning, wherein the detected data is an image scanning data of the electronic equipment;
analyze a damage condition of the spatial model and repair the damage condition of the spatial model; and
displaying the electronic equipment information.

11. The management method for electronic equipment according to claim 10, wherein the detected data further includes one of sound and position information of a management apparatus, and the step of identifying the electronic equipment according to the detected data of the electronic equipment comprises:
identifying the electronic equipment conformed to the sound, or comparing adjacent electronic equipment on an electronic map according to the position information.

12. The management method for electronic equipment according to claim 10, after the step of obtaining the relevant detected data of the electronic equipment, further comprising:
obtaining work order information according to the detected data, the work order information being related to construction or maintenance and operation of the electronic equipment; and
integrating the work order information with the electronic equipment information, and presenting an integration result on a display.

13. The management method for electronic equipment according to claim 10, after the step of obtaining the relevant detected data of the electronic equipment, further comprising:
identifying an equipment defect according to the detected data, the equipment defect being related to a construction fault or an equipment trouble; and
obtaining corresponding solution information according to the equipment defect.

14. The management method for electronic equipment according to claim 10, after the step of obtaining the electronic equipment information according to the identified result of the electronic equipment, further comprising:

selecting the spatial model according to the identified result;

constructing the spatial model on a background image, the background image being one of a virtual image or a real-time image; and combining the spatial model with the background image to present on a display.

15. The management method for electronic equipment according to claim 14, further comprising:

selecting an initial framework;

constructing a main body based on the initial framework and reserving a component space in the main body;

selecting at least one object placed in the component space of the main body;

re-constructing the main body in response to insufficiency of the component space; and preserving the at least one object and corresponding data by classification.

16. The management method for electronic equipment according to claim 14, wherein the step of presenting on the display comprises:

presenting the spatial model on the display in micro-scale in response to an magnifying operation.

17. The management method for electronic equipment according to claim 10, after the step of obtaining the relevant detected data of the electronic equipment, further comprising:

sending the detected data; and obtaining rear-end information corresponding to the detected data, the rear-end information being related to information of equipment setting, manual operation or troubleshooting.

18. The management method for electronic equipment according to claim 10, after the step of identifying the electronic equipment information according to the detected data of the electronic equipment, further comprising:

obtaining information about different brands or models or a specification comparison sheet for the identified result of the electronic equipment.

* * * * *